(12) United States Patent
Liu

(10) Patent No.: US 11,784,289 B2
(45) Date of Patent: Oct. 10, 2023

(54) LIGHT EMITTING DIODE HAVING REFLECTIVE PORTION FOR REFLECTING LIGHT AND DIFFUSING CURRENT AND DISPLAY DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Kuang-Wei Liu, Chengdu (CN)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 134 days.

(21) Appl. No.: 17/490,099

(22) Filed: Sep. 30, 2021

(65) Prior Publication Data
US 2023/0014671 A1 Jan. 19, 2023

(30) Foreign Application Priority Data
Jul. 14, 2021 (CN) .......................... 202110794408.0

(51) Int. Cl.
*H01L 33/40* (2010.01)
*H01L 25/075* (2006.01)
*G02F 1/13357* (2006.01)

(52) U.S. Cl.
CPC ........ *H01L 33/405* (2013.01); *H01L 25/0753* (2013.01); *G02F 1/133603* (2013.01)

(58) Field of Classification Search
CPC ... H01L 33/405; H01L 25/0753; H01L 33/46; G02F 1/133603
See application file for complete search history.

(56) References Cited

U.S. PATENT DOCUMENTS

| | | | |
|---|---|---|---|
| 2005/0007516 A1* | 1/2005 | Hong | ...................... G09G 3/342 349/64 |
| 2019/0058088 A1* | 2/2019 | Jung | ........................ H01L 33/14 |
| 2021/0202571 A1* | 7/2021 | Chen | ..................... H01L 27/156 |

(Continued)

FOREIGN PATENT DOCUMENTS

| | | | | |
|---|---|---|---|---|
| CN | 112331753 A | * | 2/2021 | ........... H01L 33/382 |
| EP | 3809462 A1 | * | 4/2021 | ............... G09F 9/33 |

OTHER PUBLICATIONS

Liu, CN112331753A, Machine Translation (Year: 2021).*

*Primary Examiner* — Tracie Y Green
(74) *Attorney, Agent, or Firm* — ScienBiziP, P.C.

(57) ABSTRACT

A light emitting diode includes a light emitting portion, a first electrode, a first reflecting portion, and a second electrode. The first reflecting portion includes conductive material. The first electrode is in electrical contact with the first reflecting portion. The second electrode is electrically connected to the light emitting portion. The first electrode and the second electrode receive different driving voltages and apply the driving voltage to the light emitting portion to drive the light emitting portion to emit light, the first reflecting portion being configured to reflect the light from the light emitting portion.

20 Claims, 8 Drawing Sheets

(56) References Cited

U.S. PATENT DOCUMENTS

2021/0366981 A1\* 11/2021 Yeon ..................... H01L 33/502
2023/0069883 A1\* 3/2023 Jang ................... H01L 33/0093
2023/0132771 A1\* 5/2023 Han ....................... H01S 5/042
250/370.08

\* cited by examiner

LIGHT EMITTING DIODE HAVING REFLECTIVE PORTION FOR REFLECTING LIGHT AND DIFFUSING CURRENT AND DISPLAY DEVICE USING SAME

FIELD

The subject matter herein generally relates to displays, and particularly relates to a light emitting diode and a display device including the light emitting diode.

BACKGROUND

A conventional display device comprises a plurality of mini light emitting diodes as a light source. Each mini light emitting diode comprises a distribution Bragg reflector. The distribution Bragg reflector is configured to reflect light with a certain wavelength to prevent light from the mini light emitting diodes from exiting toward a certain direction. Each mini light emitting diode further comprises an electrode and other conductive structures, and the distribution Bragg reflector defines a through hole. The electrode extends into the through hole to electrically connect with the other conductive structures. However, the distribution Bragg reflector is susceptible to falling off, which results in failure of the mini light emitting diodes.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
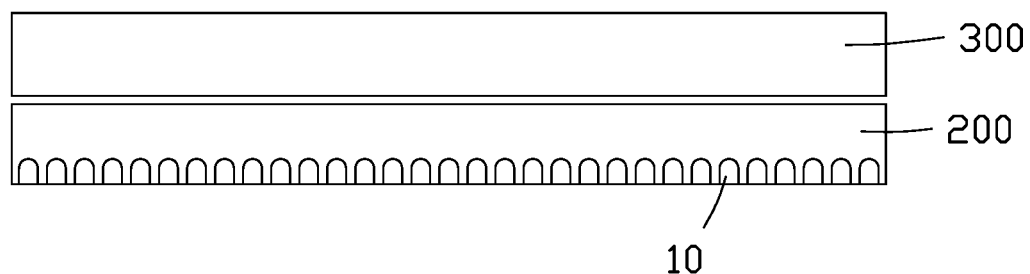
FIG. 1 is a schematic diagram of a display device in an embodiment of the present disclosure.

It will be appreciated that for simplicity and clarity of illustration, where appropriate, reference numerals have been repeated among different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

As shown in FIG. 1, a display device 100 is used to display images. The display device 100 may be a liquid crystal display device, a micro light emitting diode display device, or the like.

In this embodiment, the display device 100 is a liquid crystal display device. The display device 100 comprises a backlight module 200 and a liquid crystal display panel 300. The backlight module 200 comprises many light emitting diodes (LEDs) 10 arranged in an array. Each of the LEDs 10 is a mini LED and 10 is used to emit source light. The display panel 300 is on a light path of the source light and is used to modulate the source light received to generate light for displaying the images, wherein the light is transmitted by the display panel 300 from a side away from the backlight module 200.

In at least one embodiment of the present disclosure, the display device 100 is a micro light emitting diode display device display device, wherein the display device 100 comprises a plurality of LEDs 10 arranged in an array and each of the LEDs 10 is a Micro LED. Since a size of a Micro LED is much smaller than a size of a mini LED, one LED 10 can be used as a light emitting component in a sub-pixel to emit light for displaying the images in the at least one embodiment. That is, the display device 10 of the at least one embodiment is a self-illuminating display device.

Figure 2:
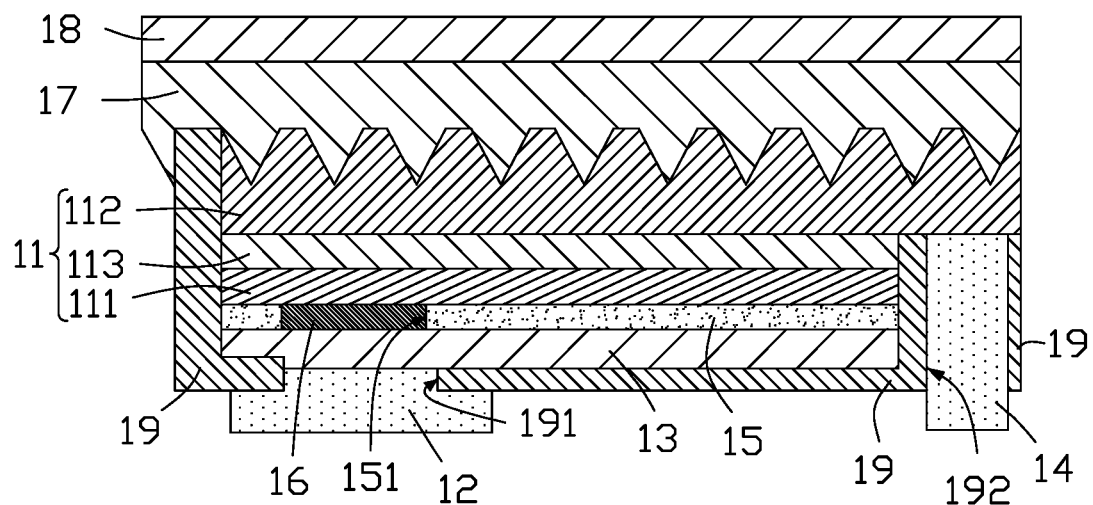
FIG. 2 is a cross-sectional view of a light emitting diode in the display device of FIG. 1.

As shown in FIG. 2, in this embodiment, each of the LEDs 10 comprises a light emitting portion 11, a first electrode 12, a first reflecting portion 13, and a second electrode 14. The first electrode 12 and the second electrode 14 are electrically connected to the light emitting portion 11. When the first electrode 12 and the second electrode 14 are supplied with different driving voltages, the light emitting portion 11 can emit the source light according to the driving voltages on the first electrode 12 and the second electrode 14. The first reflecting portion 13 is used to reflect the source light emitted by the light emitting portion 11 to prevent the source light from escaping from a side of the first reflecting portion 13 away from the light emitting portion 11.

The light emitting portion 11 comprises a first semiconductive layer 111, a second semiconductive layer 112, and a light emitting layer 113 between the first semiconductive layer 111 and the second semiconductive layer 112. Both the first semiconductive layer 111 and the second semiconductive layer 112 comprise semiconductor materials. In this embodiment, the first semiconductive layer 111 is made of P-type gallium nitride (GaN), and the second semiconductive layer 112 is made of N-type gallium nitride (GaN). In at least one embodiment of the present disclosure, the first semiconductive layer 111 may be made of N-type GaN and the second semiconductive layer 112 may be made of P-type GaN. In this embodiment, the light emitting layer 113 is made of indium gallium nitride (InGaN). The first electrode 12 is configured to apply a first driving voltage to the first semiconductive layer 111 and the second electrode 14 is configured to apply a second driving voltage to the second semiconductive layer 112. When the driving voltages (including the first driving voltage and the second driving voltage) are applied to the first semiconductive layer 111 and the second semiconductive layer 112, charge carriers in the first semiconductive layer 111 and the second semiconductive layer 112 migrate to generate an electrical current, which makes the light emitting layer 113 to emit the source light.

The first electrode 12 and the second electrode 14 are made of conductive materials. In this embodiment, both the first electrode 12 and the second electrode 14 are made of metal, such as nickel (Ni) or gold (Au). The first electrode 12 is electrically connected to the first semiconductive layer 111 for applying the first driving voltage to the first semiconductive layer 111. The second electrode 14 is electrically connected to the second semiconductive layer 112 for applying the second driving voltage to the second semiconductive layer 112.

The first reflecting portion 13 is on a side of the first semiconductive layer 111 away from the light emitting layer 113. The first electrode 12 is on a side of the first reflecting portion 13 away from the first semiconductive layer 111 and in electrical contact with a surface of the first reflecting portion 13 away from the first semiconductive layer 111. In this embodiment, the first reflecting portion 13 comprises conductive material, and the first electrode 12 is electrically connected to the first semiconductive layer 111 through the first reflecting portion 13.

Figure 3:
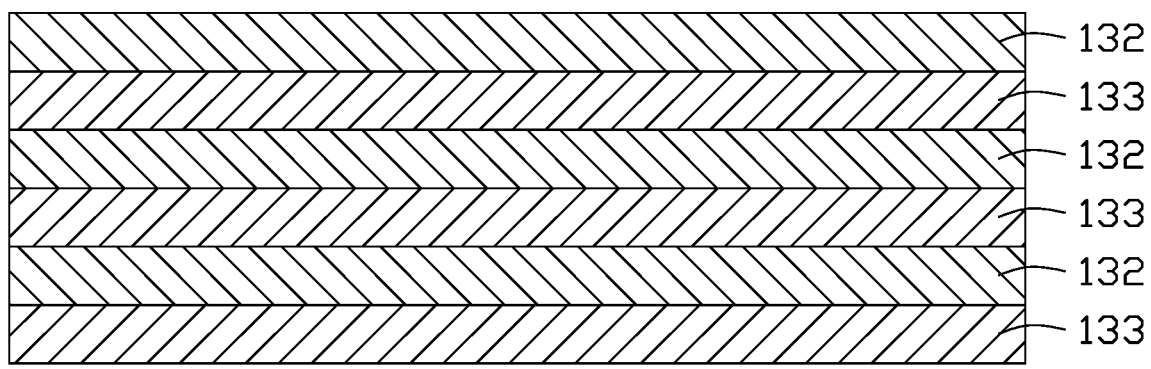
FIG. 3 is a cross-sectional view of a first reflecting portion of the light emitting diode of FIG. 2.

As shown in FIG. 3, the first reflecting portion 13 comprises a plurality of first conductive layers 132 and a plurality of second conductive layers 133 stacked in an alternating fashion. That is, one second conductive layer 133 is between two first conductive layers 132, and one first conductive layer 132 is between two second conductive layers 133. The first conductive layers 132 have a single refractive index, the second conductive layers 133 have a single refractive index, these refractive indexes are different. The plurality of first conductive layers 132 and the plurality of second conductive layers 133 constitute a Bragg reflector. That is, the first reflecting portion 13 is a Bragg reflector and is used to reflect the source light with a certain wavelength.

The first conductive layers 132 have a same thickness, such thickness is λ/(4n), wherein λ is the wavelength of the source light and n is the refractive index of each of the first conductive layers 132. The second conductive layers 133 have a same thickness, such thickness is λ(4n), wherein λ is the wavelength of the source light and n is the refractive index of each of the second conductive layers 133.

A reflectivity R of the first reflecting portion 13 reflecting the source light satisfies the following formula (formula 1):

$$R = \left[\frac{\left(\frac{n_1}{n_2}\right)^{2N} - 1}{\left(\frac{n_1}{n_2}\right)^{2N} + 1}\right]^2,$$

wherein n1 is the refractive index of the first conductive layer 132, n2 is the refractive index of the second conductive layer 133, and N is a number of the first conductive layers 132 or the second conductive layers 133 (a number of the first conductive layers 132 is the same as a number of the second conductive layers 133). According to the formula 1, the reflectivity R can reach an expected value by adjusting values of n1, n2, and N. In this embodiment, if the wavelength of the source light is 450 nanometers and the value of N is 26, the reflectivity R of the first reflecting portion 13 reflecting the source light can reach 99.9995%.

Each of the first conductive layers 132 is made of oxide containing indium and tin and each of the second conductive layers 133 is made of oxide containing titanium and niobium, or vice versa regarding layers 133 and 132. In this embodiment, the oxide containing indium and tin is In2O3:Sn, and the oxide containing titanium and niobium is TiO2:Nb. In this embodiment, each of the first conductive layers 132 is made of In2O3:Sn and each of the second conductive layers 133 is made of TiO2:Nb. An impedance of each of the first conductive layers 132 can be adjusted by adjusting an amount of Sn doped in the first conductive layer 132, an impedance of each of the second conductive layers 133 can be adjusted by adjusting an amount of Nb doped in the second conductive layer 133, wherein the impedance of each of the first conductive layers 132 and the impedance of each of the second conductive layers 133 are different.

Figure 4:
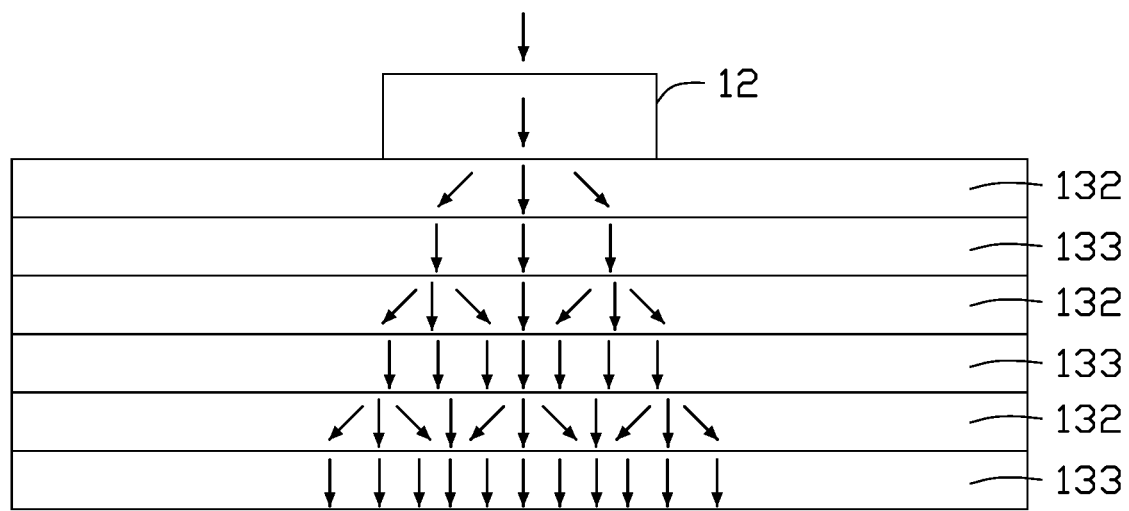
FIG. 4 is a schematic diagram of a diffusion process of an electrical current in the first reflecting portion of FIG. 2.

In this embodiment, the impedance of each of the first conductive layers 132 is less than the impedance of each of the second conductive layers 133. As shown in FIG. 4, an electrical current from the first electrode 12 flows into one of the first conductive layer 132 first, wherein the electrical current diffuses mainly horizontally (referring to FIG. 4) in the first conductive layer 132 until flowing into a second conductive layer 133 next to the first conductive layer 132. The electrical current diffuses mainly vertically (referring to FIG. 4) in the second conductive layer 133 until flowing into a first conductive layer 132 next to the second conductive layer 133. According to manner of diffusion described above, the electrical current has a large diffusion area in a horizontal direction after flowing through the first conductive layers 132 and the second conductive layers 133. Therefore, the first reflecting portion 13 is conducive to diffusing the electrical current in the horizontal direction, which helps to diffuse the electrical current to the light emitting portion 11 and improve a luminous efficiency of the LEDs 10.

In other embodiments, each of the LEDs 10 further comprises an electrical current diffusion layer including conductive material to diffuse the electrical current in a certain direction. In this embodiment, the first reflecting portion 13 comprises the first conductive layers 132 and the second conductive layers 133, and the impedance of each of the first conductive layers 132 is different from the impedance of each of the second conductive layers 132, which allows the first reflecting portion 13 to reflect the source light in addition to diffusing the electrical current. Therefore, the first reflecting portion 13 in this embodiment has a reduced thickness of current diffusion layer, enabling a reduction of thickness of each of the LEDs 10 and simplifying a manufacturing process of each of the LEDs 10.

As shown in FIG. 2, each of the LEDs 10 further comprises a blocking portion 16 and an ohmic contact layer 15 between the first reflecting portion 13 and the first semiconductive layer 111. In this embodiment, the ohmic contact layer 15 is made of indium tin oxide and is used to improve electrical contact strength of the first reflecting portion 13 and the first semiconductive layer 111. The ohmic contact layer 15 is provided with a through hole 151, wherein the blocking portion 16 is in the through hole 151. The blocking portion 16 is made of insulating material, so that when the electrical current is transmitted to the blocking portion 16, vertical transmission through the blocking part 16 (referring to FIG. 2) is prevented, forcing the electrical current into horizontal transmission only. That is, similar to the first reflecting portion 13, the blocking portion 16 is also helpful in diffusing the current into the horizontal direction, which diffuses the electrical current to the light emitting portion 11 evenly and improves the luminous efficiency of the LED 10s.

Each of the LEDs 10 also comprises a substrate 17 on a side of the second semiconductive layer 112 away from the light emitting layer 113 and is in direct contact with the second semiconductive layer 112. The substrate 17 is made of sapphire material and configured for growing the light emitting portion 11.

Each of the LEDs 10 further comprises a second reflecting portion 18 at a side of the substrate 17 away from the second semiconductive layer 112, and in direct contact with a surface of the substrate 17 away from the second semiconductive layer 112. The second reflecting portion 18 is used to reflect the source light received to prevent the source light from exiting from the side of the first reflecting portion 13 away from the light emitting portion 11. In this embodiment, the second reflecting portion 18 is also a Bragg reflector. In this embodiment, since the second reflecting portion 18 does not need to diffuse the electrical current, the second reflecting portion 18 is made of insulating material.

Each of the LEDs 10 further comprises an insulating layer 19 covering the light emitting portion 11 and the first reflecting portion 13. The insulating layer 19 is made of opaque material, wherein the insulating layer 19 is configured to reflect at least part of the source light received, which may prevent the source light transmitting from the insulating layer 19. The insulating layer 19 is also used to protect the light emitting portion 11 from abrasion.

The insulating layer 19 is provided with a through hole 191 and a through hole 192. The first electrode 12 is partially in the through hole 191 to be in electrical contact with the first reflecting portion 13, so that the first driving voltage received is applied to the first semiconductive layer 111 through the first reflecting portion 13 and the ohmic contact layer 15. The second electrode 14 is in the through hole 192 to be in electrical contact with the second semiconductive layer 112, so that the second driving voltage received is applied to the second semiconductive layer 112.

When the first electrode 12 receives the first driving voltage and the second electrode 14 receives the second driving voltage (these voltages having different values), the first semiconductive layer 111 and the second semiconductive layer 112 are supplied with the driving voltages, so the first electrode 12, the first reflecting portion 13, the ohmic contact layer 15, the light emitting portion 11, and the second electrode 14 form a current loop, and a voltage difference arises on two sides of the light emitting layer 113, emitting the source light. The source light emitted by the light emitting layer 113 transmits in various directions. The source light incident on the insulating layer 19, the first reflecting portion 13, and the second reflecting portion 18 is reflected, and the source light incident on the substrate 17 is transmitted, which makes the LEDs 10 of this embodiment side-emitting LEDs.

Figure 5:
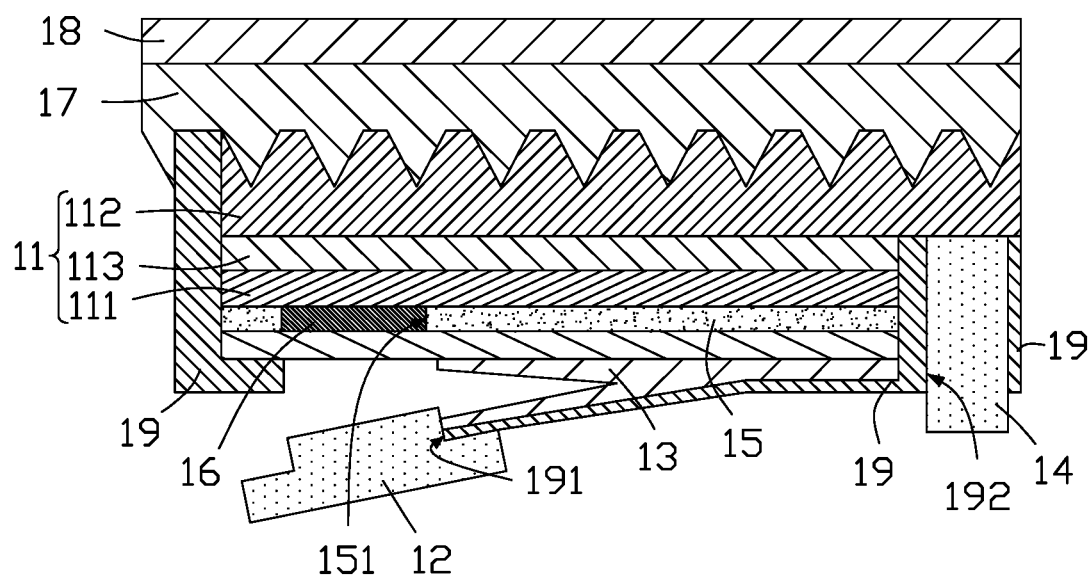
FIG. 5 is a schematic diagram of the light emitting diode of FIG. 2 with the first reflecting portion out of place.

As shown in FIG. 5, when the first reflecting portion 13 and the insulating layer 19 are displaced due to an external force, the first electrode 12 in the through hole 191 may peel off. In this embodiment, since the first reflecting portion 13 is conductive, even if the first electrode 12 is peeled off, the first electrode 12 can still be electrically connected to the ohmic contact layer 15 through the first reflecting portion 13, thereby supplying the first driving voltage to the first semiconductive layer 111. That is, even if the first electrode 12 is peeled off, the first electrode 12, the first reflecting portion 13, the ohmic contact layer 15, the light emitting portion 11, and the second electrode 14 can still form the current loop, causing the voltage difference between the two sides of the light emitting layer 113, and emitting source light. Therefore, the first reflecting portion 13 has conductivity, which enables the LEDs 10 of this embodiment to emit source light as normal even if the first electrode 12 is peeled off. Therefore, the LEDs 10 in this embodiment have improved working stability and service longevity. In addition, compared to a conventional reflecting portion, the first reflecting portion 13 of this embodiment does not need extra manufacturing process, which simplifies the manufacturing process of the LEDs 10.

Figure 6:
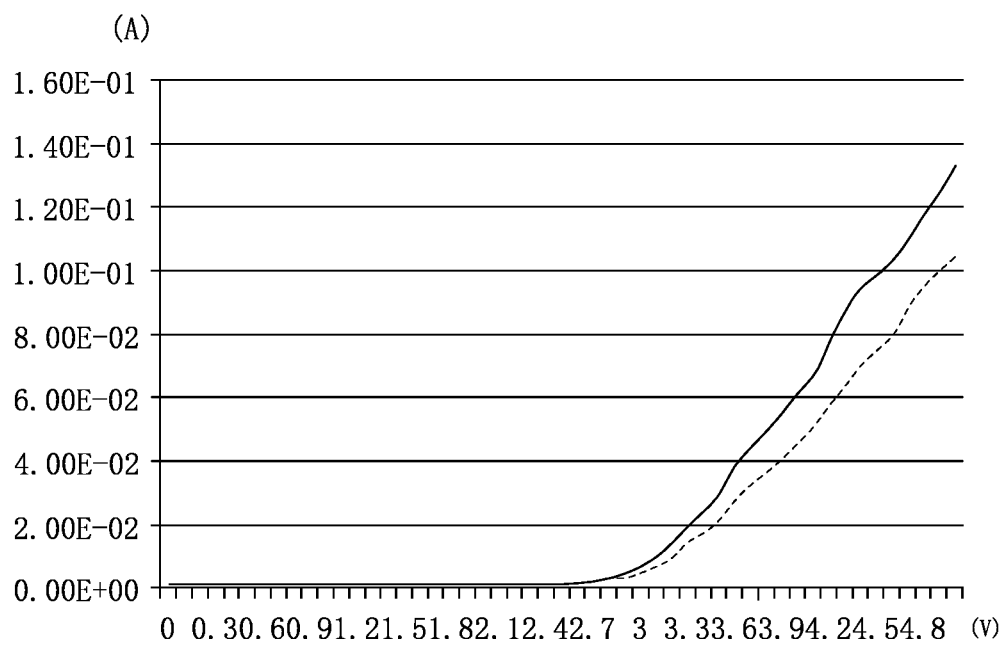
FIG. 6 is a schematic diagram of volt-ampere curves of the light emitting diodes of the present disclosure and a light emitting diode in the prior art.

FIG. 6 shows volt-ampere curves of the LEDs 10 of the present disclosure and a conventional LED. A horizontal axis in FIG. 6 represents the voltage difference, and a vertical axis in FIG. 6 represents a working current, wherein the larger the working current, the greater the luminosity. A solid line in FIG. 6 represents the volt-ampere curve of each of the LEDs 10 of the present disclosure, and the dashed line in FIG. 6 represents the volt-ampere curve of the conventional LED of existing art. Referring to FIG. 6, the working current of each of the LEDs 10 of the present disclosure is greater than that of the conventional LED when the voltage differences are the same. That is, the luminosity of each of the LEDs 10 of the present disclosure is greater than that of the conventional LED when the voltage differences are the same.

Figure 7:
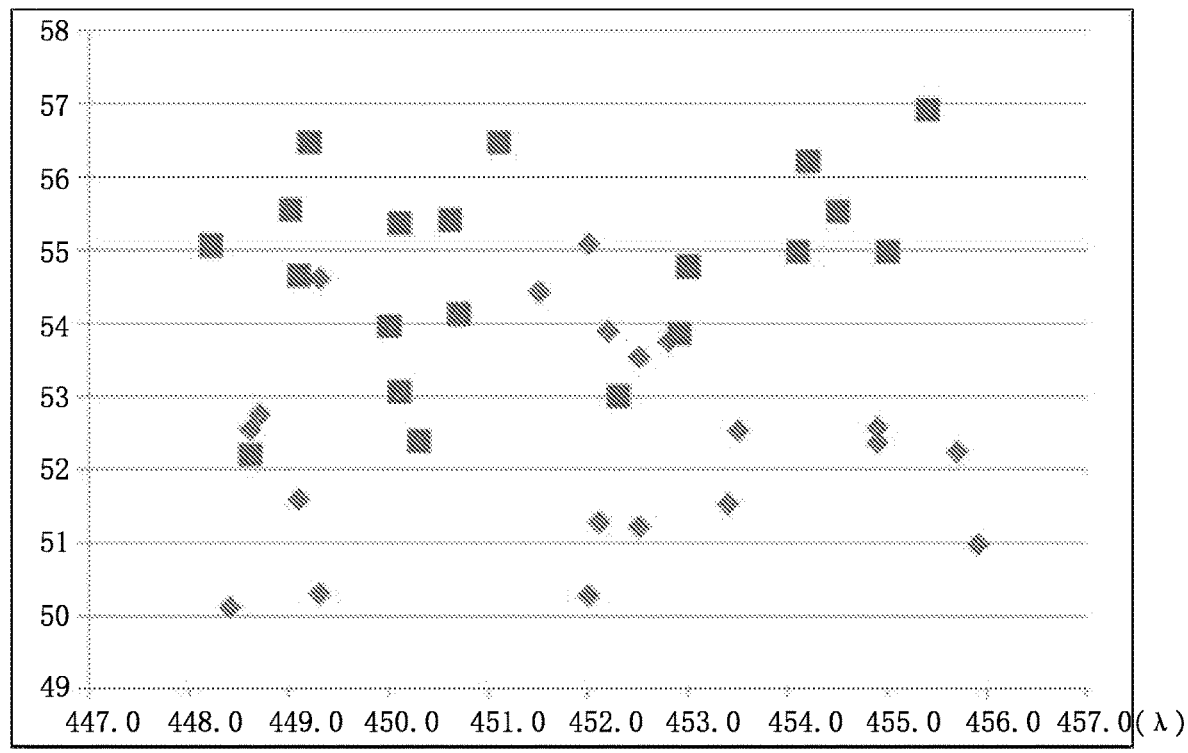
FIG. 7 is a schematic diagram of brightness distribution of the light emitting diodes of the present disclosure and that of a light emitting diode in the prior art.

FIG. 7 shows distributions of the luminosity of each of the LEDs 10 of the present disclosure and of the conventional LED. A horizontal axis in FIG. 7 represents the wavelength of the source light, and a vertical axis in FIG. 7 represents the luminosity. Square shapes in FIG. 7 represent the luminosity of each of the LEDs 10 of the present disclosure, the diamond shapes in FIG. 7 represent the luminous brightness of the conventional LED. Referring to FIG. 7, for the source light with various wavelengths, the luminous brightness of each of the LEDs 10 of the present disclosure is generally higher than that of the conventional LED.

Figure 8:
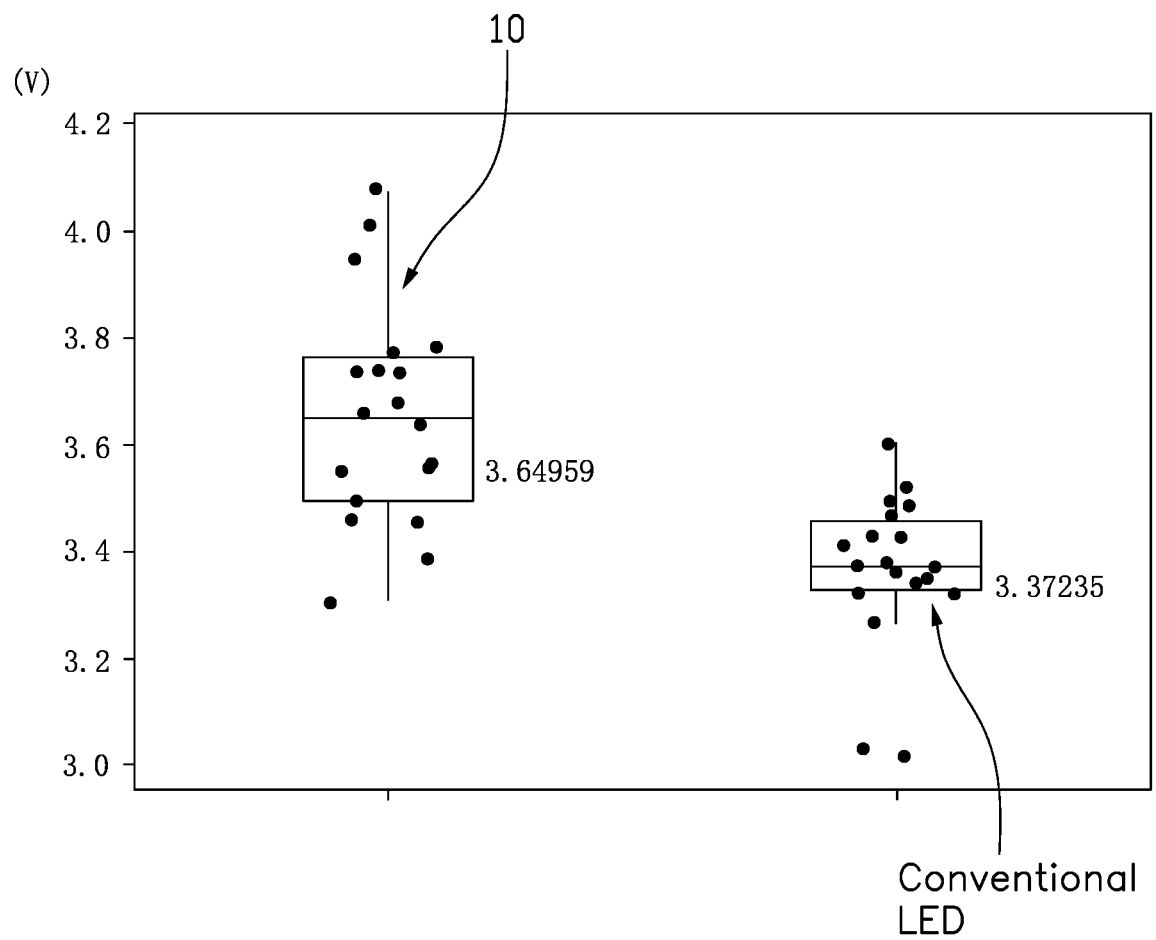
FIG. 8 is a schematic diagram of a distribution of starting voltages of the light emitting diodes of the present disclosure and those of the light emitting diode in the prior art.

FIG. 8 shows distributions of starting voltages of each of the LEDs 10 of the present embodiment and of the conventional LED. A vertical axis in FIG. 8 represents the starting voltages. Referring to FIG. 8, the starting voltage of each of the LEDs 10 of the present disclosure is generally smaller than that of the conventional LED. That is, each of the LEDs 10 of the present disclosure requires a smaller starting voltage than that of the conventional LED to reach a working state, and the luminous efficiency of each of the LEDs 10 is higher than that of the conventional LED.

The LEDs 10 in the present disclosure reduce the diffusion layer, so that the source light passes through fewer layers and loses less energy when transmitted from the LEDs 10. The source light is reflected repeatedly by the first reflecting portion 13, the second reflecting portion 18, and the insulating layer 19 in the LEDs 10, which is conducive to improving the luminous brightness and the luminous efficiency of the source light emitted by the LEDs 10 in the present disclosure.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A light emitting diode, comprising:
   a light emitting portion;
   a first electrode;
   a first reflecting portion comprising conductive material, the first electrode electrically contacting the first reflecting portion to electrically connect the light emitting portion; and
   a second electrode electrically connected to the light emitting portion;
   wherein the first electrode and the second electrode are configured to receive driving voltages to drive the light emitting portion to emit light; the first reflecting portion is configured to reflect light from the light emitting portion; the first reflecting portion comprises a plurality of first conductive layers and a plurality of second conductive layers; one of the plurality of first conductive layers alternatives with one of the plurality of second conductive layers; and an impedance of each of the plurality of first conductive layers is different from an impedance of each of the plurality of second conductive layers.

2. The light emitting diode of claim 1, wherein the light emitting portion comprises a first semiconductive layer, a second semiconductive layer, and a light emitting layer between the first semiconductive layer and the second semiconductive layer;
   the first reflecting portion is on a side of the first semiconductive layer away from the light emitting layer, and the first electrode is electrically connected to the first semiconductive layer by the first reflecting portion; and
   the second electrode is electrically connected to the second semiconductive layer, the first electrode is configured to apply a first driving voltage to the first semiconductive layer, the second electrode is configured to apply a second driving voltage to the second semiconductive layer, the first driving voltage and the second driving voltage are configured to drive the light emitting layer to emit light, and the first reflecting portion is configured to reflect the light from the light emitting layer.

3. The light emitting diode of claim 1, wherein each of the plurality of first conductive layers is made of oxide containing indium and tin; and each of the plurality of second conductive layers is made of oxide containing titanium and niobium; or
   each of the plurality of second conductive layers is made of oxide containing titanium and niobium and each of the plurality of first conductive layers is made of oxide containing indium and tin.

4. The light emitting diode of claim 2, further comprising an ohmic contact layer between the first reflecting portion and the first semiconductive layer.

5. The light emitting diode of claim 4, wherein the ohmic contact layer is made of indium tin oxide.

6. The light emitting diode of claim 4, further comprising a blocking portion embedded in the ohmic contact layer, wherein the blocking portion is made of insulating material and is configured for blocking electrical current.

7. The light emitting diode of claim 2, further comprising a second reflecting portion on a side of the second semiconductive layer away from the light emitting layer; wherein the second reflecting portion is configured to reflect the light from the light emitting layer.

8. The light emitting diode of claim 7, wherein the second reflecting portion is made of insulating material.

9. A display device comprising a plurality of light emitting diodes, each of the plurality of light emitting diodes comprising:
   a light emitting portion;
   a first electrode;
   a first reflecting portion comprising conductive material, the first electrode electrically contacting the first reflecting portion to electrically connect the light emitting portion; and
   a second electrode electrically connected to the light emitting portion;
   wherein each of the first electrode and the second electrode are configured to receive driving voltages to drive the light emitting portion to emit light, and the first reflecting portion is configured to reflect light from the light emitting portion; the plurality of light emitting diodes are configured to emit light independently from each other to make the display device to display images; the first reflecting portion comprises a plurality of first conductive layers and a plurality of second conductive layers; one of the plurality of first conductive layers alternatives with one of the plurality of second conductive layers; and an impedance of each of the plurality of first conductive layers is different from an impedance of each of the plurality of second conductive layers.

10. The display device of claim 9, wherein the light emitting portion comprises a first semiconductive layer, a second semiconductive layer, and a light emitting layer between the first semiconductive layer and the second semiconductive layer;
    the first reflecting portion is on a side of the first semiconductive layer away from the light emitting layer, and the first electrode is electrically connected to the first semiconductive layer by the first reflecting portion; and
    the second electrode is electrically connected to the second semiconductive layer, the first electrode is configured to apply a first driving voltage to the first semiconductive layer, the second electrode is configured to apply a second driving voltage to the second semiconductive layer, the first driving voltage and the second driving voltage are configured to drive the light emitting layer to emit light, and the first reflecting portion is configured to reflect the light from the light emitting layer.

11. The display device of claim 9, wherein each of the plurality of first conductive layers is made of oxide containing indium and tin and each of the plurality of second conductive layers is made of oxide containing titanium and niobium; or
    each of the plurality of second conductive layers is made of oxide containing titanium and niobium and each of the plurality of first conductive layers is made of oxide containing indium and tin.

12. The display device of claim 10, wherein each of the plurality of light emitting diodes further comprises an ohmic contact layer between the first reflecting portion and the first semiconductive layer.

13. The display device of claim 12, wherein the ohmic contact layer is made of indium tin oxide.

14. The display device of claim 12, wherein each of the plurality of light emitting diodes further comprises a blocking portion embedded in the ohmic contact layer; and
    the blocking portion is made of insulating material and is configured for blocking electrical current.

15. The display device of claim 10, wherein each of the plurality of light emitting diodes further comprises a second reflecting portion on a side of the second semiconductive layer away from the light emitting layer; and the second reflecting portion is configured to reflect the light from the light emitting layer.

16. The display device of claim 15, wherein the second reflecting portion is made of insulating material.

17. The display device of claim 9, wherein each of the plurality of light emitting diodes is configured to emit light for displaying the images; or the display device further comprises a display panel, each of the plurality of light emitting diodes is configured to emit source light, and the display panel is configured to modulate the source light to generate light for displaying the images.

18. The display device of claim 13, wherein the ohmic contact layer is in direct contact with one of the plurality of second conductive layers.

19. The display device of claim 14, wherein the blocking portion is in direct contact with the first reflecting portion.

20. The light emitting diode of claim 5, wherein the ohmic contact layer is in direct contact with one of the plurality of second conductive layers.

* * * * *